US009323285B2

(12) United States Patent
Lewis (10) Patent No.: US 9,323,285 B2
(45) Date of Patent: Apr. 26, 2016

(54) METASTABILITY PREDICTION AND AVOIDANCE IN MEMORY ARBITRATION CIRCUITRY

(71) Applicant: Altera Corporation, San Jose, CA (US)

(72) Inventor: David Lewis, Toronto (CA)

(73) Assignee: Altera Corporation, San Jose, CA (US)

(*) Notice: Subject to any disclaimer, the term of this patent is extended or adjusted under 35 U.S.C. 154(b) by 263 days.

(21) Appl. No.: 13/966,130

(22) Filed: Aug. 13, 2013

(65) Prior Publication Data

US 2015/0052380 A1    Feb. 19, 2015

(51) Int. Cl.
  *G06F 1/08* (2006.01)
  *G11C 7/10* (2006.01)
  *G11C 7/22* (2006.01)

(52) U.S. Cl.
  CPC .............. *G06F 1/08* (2013.01); *G11C 7/1075* (2013.01); *G11C 7/222* (2013.01)

(58) Field of Classification Search
  None
  See application file for complete search history.

(56) References Cited

U.S. PATENT DOCUMENTS

| 5,793,227 | A | * | 8/1998 | Goldrian ......................... 326/94 |
| 6,033,441 | A | | 3/2000 | Herbert |
| 6,622,255 | B1 | | 9/2003 | Kurd et al. |
| 7,225,283 | B1 | * | 5/2007 | Nayak et al. .................. 710/241 |
| 2004/0158694 | A1 | | 8/2004 | Tomazin et al. |
| 2007/0091708 | A1 | | 4/2007 | Ishimoto et al. |
| 2007/0109884 | A1 | | 5/2007 | Jung |
| 2012/0124423 | A1 | * | 5/2012 | Chakravadhanula et al. .. 714/27 |

OTHER PUBLICATIONS

Hu et al., U.S. Appl. No. 13/234,925, filed Sep. 16, 2011.

* cited by examiner

*Primary Examiner* — Paul Yanchus, III (57) ABSTRACT

An integrated circuit with hazard prediction and prevention circuitry is provided. The hazard prediction circuitry may predict a future hazard condition between two periodic signals, and the hazard prevention circuitry may selectively delay at least one of the two periodic signals to avoid the predicted hazard condition. Single-port memory cells may provide multiport memory functionality using an arbitration circuit that includes the hazard prediction and prevention circuitry and receives memory access requests from at least two request generators. The arbitration circuit may operate in synchronous mode and perform port selection based on a predetermined logic table. The arbitration circuit may also operate in asynchronous mode and execute a memory access request as soon as it is received by the arbitration circuit. Metastability caused by receiving memory access requests at the same time from at least two request generators may be avoided with the hazard prediction and prevention circuitry.

25 Claims, 12 Drawing Sheets

METASTABILITY PREDICTION AND AVOIDANCE IN MEMORY ARBITRATION CIRCUITRY

BACKGROUND

Integrated circuits such as programmable integrated circuits may contain volatile memory elements in the form of static random access memory (SRAM) cells. Volatile memory elements such as SRAM cells are typically based on cross-coupled inverters (i.e., latches). The memory elements are often arranged in arrays. In a typical array, data lines are used to write data into and read data from the memory elements. Address lines may be used to select which of the memory elements are being accessed.

Certain applications require the memory elements to have dual-port capabilities (i.e., memory elements include two ports each of which is used to perform a read/write operation). To support dual-port operations, memory elements are typically formed in an eight-transistor configuration. A dual-port memory element includes two cross-coupled inverters. A first pair of access transistors is coupled to the cross-coupled inverters to serve as a first read/write port, whereas a second pair of access transistors is coupled to the cross-coupled inverters to serve as a second read/write port. A conventional eight-transistor (8T) dual-port memory cell arranged in this way, however, occupies more than double the area of a conventional six-transistor (6T) single-port memory cell.

In an effort to reduce area of dual-port memory circuitry, techniques have been developed that allow for using 6T memory elements to provide synchronous dual-port functionality (i.e., both ports are controlled using a single clock). For example, double-clocking techniques involve accessing the memory element during a high clock phase (to fulfill requests associated with a first port) and during a low clock phase (to fulfill requests associated with a second port). Double-clocking memory access, however, limits memory performance and cannot be used to support asynchronous dual-port operation (i.e., operation that involves using two separate clock signals with different clock frequency and/or phase to control the two ports).

SUMMARY

In accordance with certain aspects of the invention, circuitry may include a first input that receives a first periodic signal having a first period, a second input that receives a second periodic signal having a second period, hazard prediction circuitry, and hazard prevention circuitry. The hazard prediction circuitry may predict a future hazard condition between the first and second periodic signals. For example, the hazard prediction circuitry may predict the future hazard condition at a first instant of time, and the future hazard condition is predicted to occur at a second instant of time that is after the first instant of time. The hazard prevention circuitry may selectively delay at least one of the first and second periodic signals by a first predetermined duration during at least one clock cycle of the respective periodic signal prior to the second instant of time.

The embodiments described herein can be implemented in numerous ways, such as a process, an apparatus, a system, a device, or a method executed on a processing machine. Several inventive embodiments of the present invention are described below.

In certain embodiments, the hazard prediction circuitry may further include a delayed pulse generation circuit that generates a hazard prediction pulse having a predetermined pulse duration. The rising edge of the hazard detection pulse may be delayed with respect to an active edge of the first periodic signal by a predetermined delay interval. If desired, the above mentioned hazard prediction circuitry may further include an edge detection circuit that determines if an active edge of the second periodic signal occurs within the pulse duration of the hazard detection pulse.

Further features of the invention, its nature and various advantages, will be more apparent from the accompanying drawings and the following detailed description of the embodiments.

DETAILED DESCRIPTION

The embodiments provided herein relate to integrated circuits and more particularly to memory circuitry in integrated circuits. The memory circuitry of the present invention may be used in any suitable integrated circuit. For example, the memory circuitry may be used in an application specific integrated circuit (ASIC), an application specific standard product (ASSP), a microprocessor, or a programmable integrated circuit, to name a few.

It will be recognized by one skilled in the art, that the present exemplary embodiments may be practiced without some or all of these specific details. In other instances, well-known operations have not been described in detail in order not to unnecessarily obscure the present embodiments.

Figure 1A:
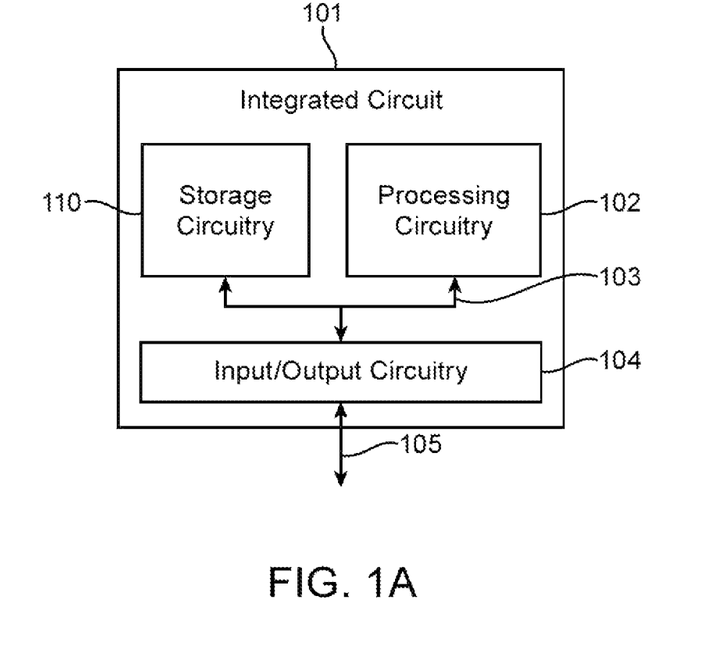
FIG. 1A is an illustrative diagram of an integrated circuit in accordance with an embodiment of the present invention.

An illustrative embodiment of an integrated circuit 101 in accordance with the present invention is shown in FIG. 1A.

Integrated circuit 101 may have multiple components. These components may include processing circuitry 102, storage circuitry 110, and input/output circuitry 104. Processing circuitry 102 may include embedded microprocessors, digital signal processors (DSP), microcontrollers, or other processing circuitry. Input/output circuitry 104 may include parallel input/output circuitry, differential input/output circuitry, serial data transceiver circuitry, or other input/output circuitry suitable to transmit and receive data. Internal interconnection resources 103 such as conductive lines and busses may be used to send data from one component to another component or to broadcast data from one component to one or more other components. External interconnection resources 105 such as conductive lines and busses, optical interconnect infrastructure, or wired and wireless networks with optional intermediate switches may be used to communicate with other devices.

Storage circuitry 110 may have random-access memory (RAM), read-only memory (ROM), or other addressable memory elements. Storage circuitry 110 may be a single-port memory, a dual-port memory, a quad-port memory, or have any other arbitrary number of ports. Alternatively, storage circuitry 110 may be implemented as a single-port memory with control circuitry that emulates dual-port, quad-port, or other multi-port behavior. Processing circuitry 102 may access storage circuitry 110 by sending read or write requests over interconnection resources 103 to storage circuitry 110. Alternatively, external components may access storage circuitry 110 via external interconnection resources 105, input/output circuitry 104, and interconnection resources 103. In response to receiving a read request, storage circuitry 110 may retrieve the requested data and send the retrieved data over interconnection resources 103 to the requestor. In case of a write request, storage circuitry 110 may store the received data.

Figure 1B:
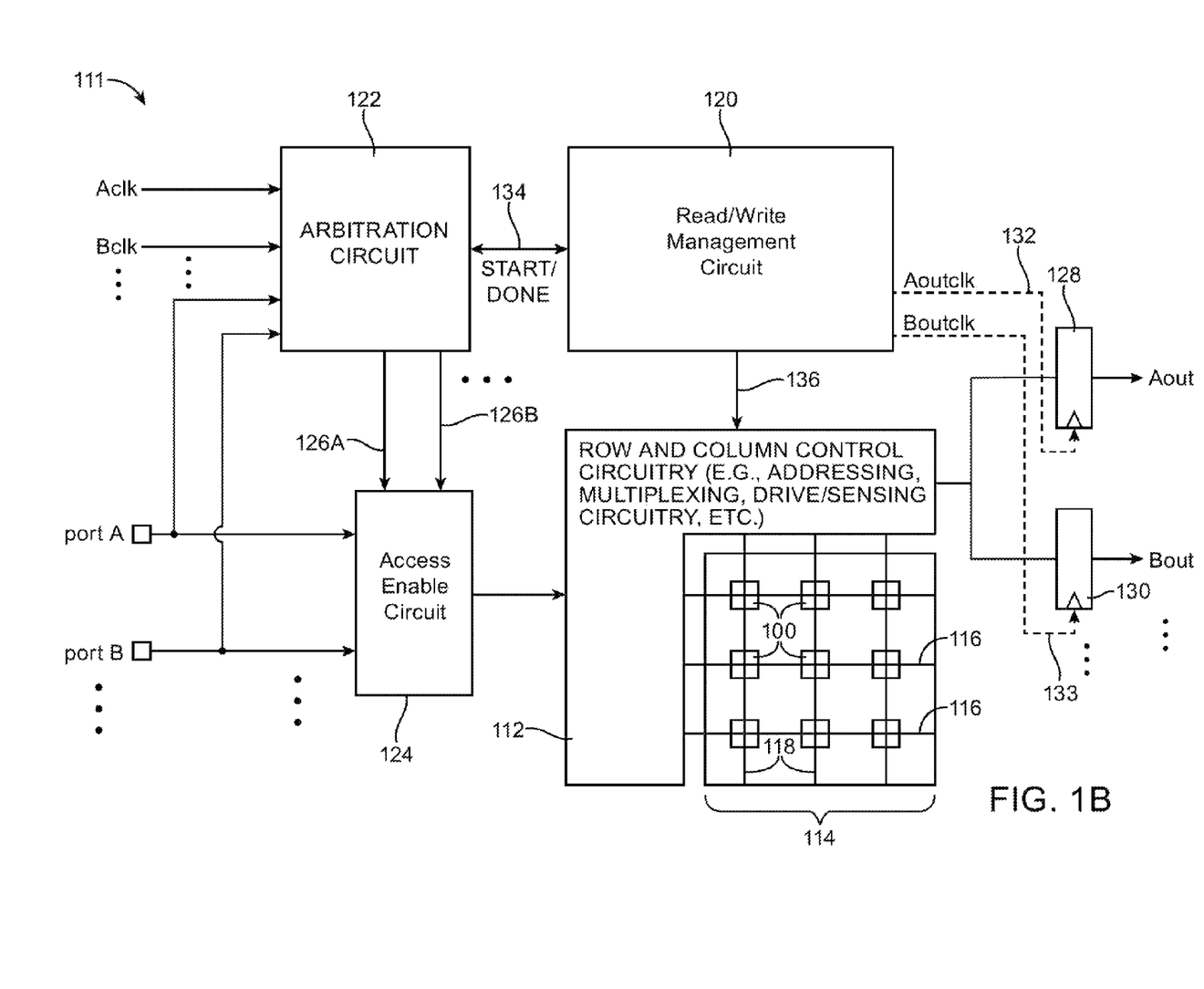
FIG. 1B is a diagram of illustrative multiport memory circuitry with an arbitration circuit in accordance with an embodiment of the present invention.

FIG. 1B is a diagram of a storage circuit 111 that includes memory circuitry having an arbitration circuit configured to provide synchronous and asynchronous multiport memory operation using only single-port memory elements. Storage circuit 111 may contain at least one memory array 114. As shown in FIG. 1B, memory array 114 may include memory elements (sometimes referred to as memory cells) 100 arranged in rows and columns. Memory cells 100 may be single-port memory cells. As an example, memory cell 100 may be a single-port differential memory cell having six transistors (e.g., a memory cell having a pair of access transistors that serve as a single port for the memory cell). Using single-port memory cells to provide dual-port memory functionality may help increase die yield, provide reduced minimum required power supply voltage (e.g., reduced power consumption), and conserve circuit area.

Memory array 114 may be coupled to row and column control circuitry such as row and column control circuitry 12. Row and column control circuitry 112 may include row addressing circuitry, column multiplexing circuitry, write driver circuitry, read sensing circuitry, data register circuitry, etc. Row and column control circuitry 112 may be used to produce desired time-varying and/or fixed signals to memory cells 100 in array 114 via paths such as paths 116 and 118. The signals that are supplied to memory elements 100 may sometimes be collectively referred to as control signals. In particular contexts, some of these signals may serve as power signals, clear signals, data signals, address signals, etc.

A power supply signal may be distributed to all of the cells in array 114 simultaneously over a global memory power line. The memory power line may be oriented vertically so that there is one branch of the memory power line in each path 118 or may be oriented horizontally so that there is one branch of the memory power line in each path 116. As an example, a positive power supply voltage Vcc may be supplied in parallel to each cell 100 using a pattern of shared horizontal or vertical conductors. A ground voltage Vss may likewise be supplied in parallel to cells 100 using a pattern of shared horizontal or vertical lines. Control lines such as address lines and data lines are typically orthogonal to each other (e.g., address lines are horizontal while data lines are vertical or vice versa).

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, less than 0.9 volts, or any other suitable voltage. Ground voltage Vss may be zero volts (as an example). In a typical arrangement, power supply voltages Vcc may be 1.0 volts, Vss may be zero volts, and the signal levels for address, data, and clear signals may range from zero volts (when low) to 1.0 volts (when high). Arrangements in which Vcc varies as a function of time, in which Vss is less than zero volts, and in which control signals are overdriven (i.e., in which control signals have signal strengths larger than Vcc-Vss) may also be used.

There may, in general, be any suitable number of conductive lines associated with paths 116 and 118. For example, each row of array 114 may include an associated address line in a respective one of paths 116, whereas each column of array 114 may include associated data lines (e.g., true and complement data lines) in a respective one of paths 118. The terms "rows" and "columns" merely represent one way of referring to particular groups of cells 100 in memory array 114 and may sometimes be used interchangeably. If desired, other patterns of lines may be used in paths 116 and 118. For example, different numbers of power supply signals, address signals, and data signals may be used.

One of the address lines 116 may supply an asserted address signal to select a row of memory cells 100 to be accessed. The address signals on address lines 116 other than the selected address line may remain de-asserted while the selected row is being accessed. The data lines in each column may be pre-charged to positive power supply voltage Vcc during read operations, whereas the data lines in each column may be driven to appropriate voltage levels to write desired write data into at least some of selected cells 100 during write operations. During normal operation, all the address signals may remain de-asserted while all the data lines may be pre-charged to Vcc (as an example).

The single-port memory cells 100 in array 114 may provide dual-port functionality through the use of peripheral memory circuitry. Row and column control circuitry 112 may receive control signals from access enable circuit 124. Access enable circuit 124 may have a first input configured to receive memory access requests (e.g., data and addressing signals) associated with a first memory port (port A), a second input configured to receive memory access request signals associated with a second memory port (port B), an output coupled to circuitry 112, and control inputs configured to receive memory access arbitration signals from arbitration circuit 122 over path 126A and 126B.

Arbitration circuit 122 may receive memory access requests from port A, memory access requests from port B, a first clock signal Aclk associated with port A, and a second clock signal Bclk associated with port B. Arbitration circuit 122 may receive memory access requests from an arbitrary number of additional ports. For example, storage circuit 111 may be configured to implement a quad-port memory. In quad-port memory configuration, arbitration circuit 122 may receive memory access requests from four ports. Arbitration circuit 122 may determine the order in which the memory access requests received on port A and port B may be granted.

Arbitration circuit 122 may drive memory access arbitration signals over paths 126A high to selectively route data and addressing signals from port A to row and column control circuitry 112 using access enable circuit 124 and may drive memory access arbitration signals over path 126B high to selectively route data and addressing signals from port B to row and column control circuitry 112 using access enable circuit 124 (as an example). When arbitration circuit 122 decides to execute a request, arbitration circuit 122 will temporarily assert signal START provided over path 134 to direct read/write management circuit 120 to enable the desired read/write operation. In response to receiving an asserted START from arbitration circuit 122, read/write management circuit 120 may provide asserted write driver enable signals to circuitry 112 during write operations and may provide asserted sense amplifier enable signals during read operations (e.g., by providing read/write enable signals from read/write management circuit 120 to circuitry 112 over path 136).

During read operations, output data signals generated using sense amplifier circuits in circuitry 112 may be fed to output latches 128 and 130. Output latch 128 may be controlled using output clock signal Aoutclk of port A provided over path 132 from circuit 120, whereas output latch 130 may be controlled using output port signal Boutclk of port B provided over path 133 from circuit 120. The latched output data signals associated with the first memory port (e.g., data signal Aout) and the latched output data signals associated with the second memory port (e.g., data signal Bout) may be provided to other digital or logic circuitry on device 111 for further processing.

When a current memory request has been fulfilled (i.e., upon completion of a read/write operation into memory array 114 at the desired memory location), arbitration circuit 122 may receive an asserted signal DONE from read/write management circuit 120. In response to detecting an asserted DONE, arbitration circuit 122 may proceed to process other pending memory access requests.

Storage circuit 111 described in FIG. 1B is merely illustrate and is not intended to limit the scope of the present invention. If desired, arbitration circuit 122 may be configured to handle memory requests from any desired number of ports to support triport memory mode, quad-port memory mode, etc.

Figure 2:
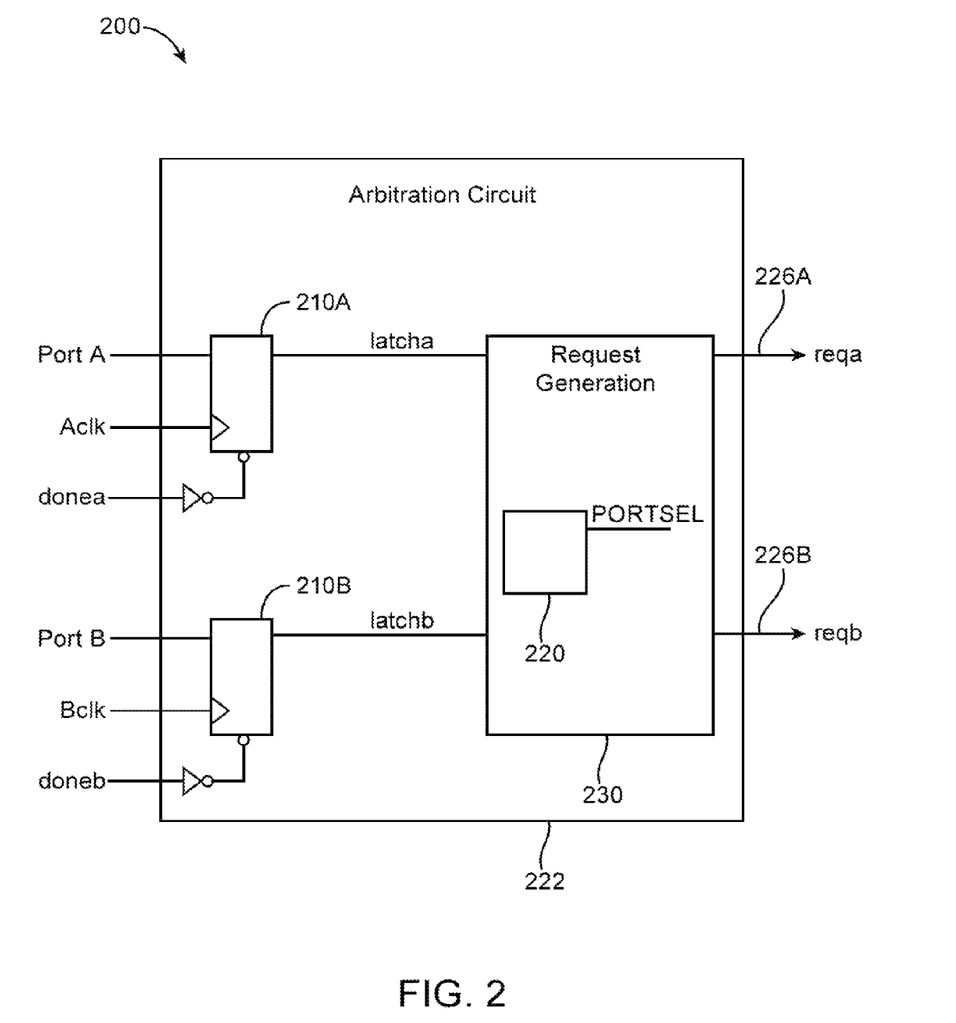
FIG. 2 is a diagram of illustrative single-port memory circuitry emulating dual-port memory circuitry with an arbitration circuit in accordance with an embodiment of the present invention.

FIG. 2 shows a diagram of illustrative arbitration circuit 222 providing memory access arbitration signals for two ports A and B over paths 226A and 226B. Arbitration circuit 222 may be operable in a synchronous mode and an asynchronous mode. In the synchronous mode, the requests from the multiple ports may be controlled using a shared clock source (e.g., clock signal Aclk is the same as clock signal Bclk). As a result, memory access requests from two or more ports may be received simultaneously at a rising edge of the shared clock signal. In synchronous mode, for example, arbitration circuit 222 may determine the order in which memory access requests received at the multiple ports are granted access to the memory.

In the scenario in which there is a pending request at only one of the two ports, the port associated with the pending request may be selected for processing. In the scenario in which one port receives a write request and the other port receives a read request, the port that receives the read request may be selected for processing (i.e., arbitration circuit 222 may be configured to implement read port priority). If desired, arbitration circuit 222 may also be configured to implement write port priority (i.e., the port that receives the write request may be selected for processing). In the scenario in which both ports receive write requests or both ports receive read requests, the second port may be given priority (i.e., the request at port B will be processed before the request at port A). If desired, arbitration circuitry 222 may also be configured to implement port A priority when both ports received the same type of memory requests (i.e., the request at port A will be processed before the request at port B when ports A and B both receive a read request or when ports A and B both receive a write request).

In another suitable arrangement, arbitration circuit 222 may be configured to operate in asynchronous mode (e.g., a mode in which requests from multiple ports are controlled using clocks of different phases and/or frequencies). In asynchronous operation mode, requests from different memory ports often arrive at different times. As a result, arbitration circuit 222 may be configured to process a first arriving memory request as soon as it is received by circuit 222 and to process a second (later) arriving memory request when the first arrive memory request has been fulfilled.

Figure 3:
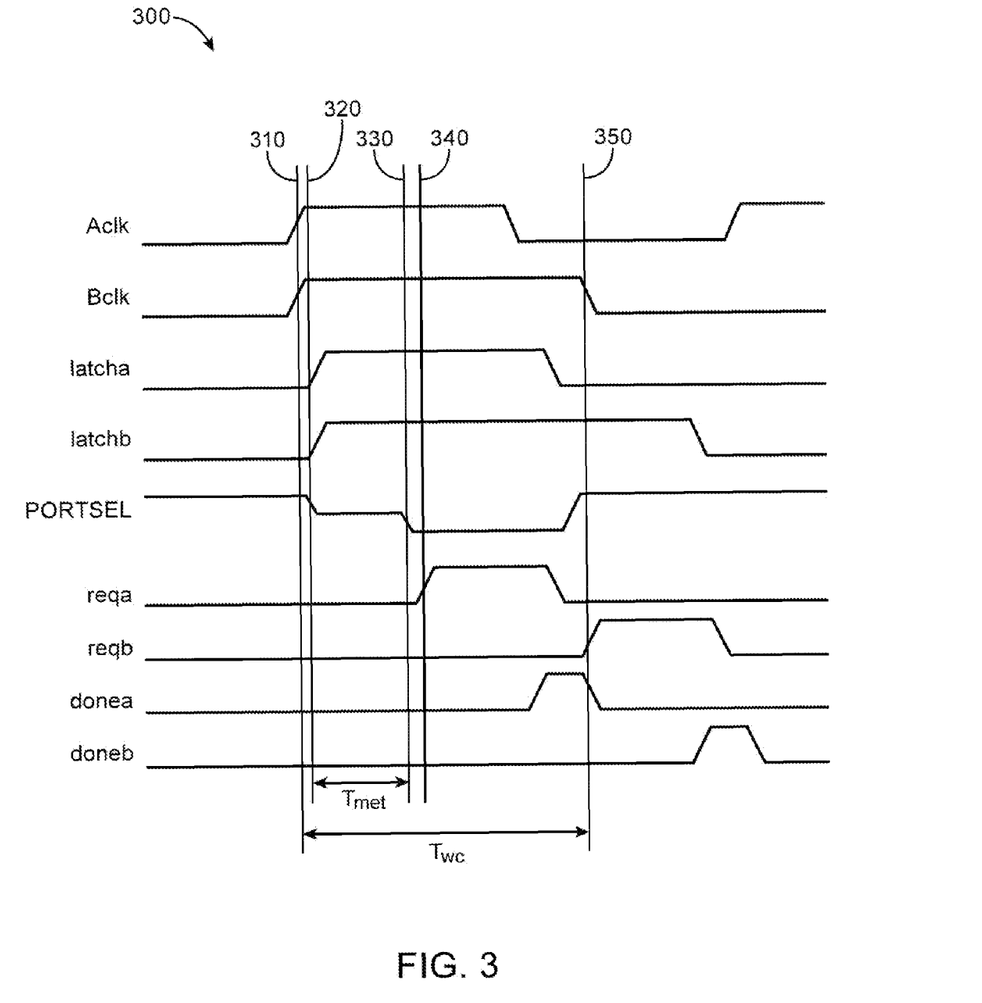
FIG. 3 is a waveform diagram showing how an asynchronous memory access request from two ports may lead to metastability in the arbitration circuit in accordance with an embodiment of the present invention.

A situation may arise during operation in asynchronous mode, where memory access requests are received simultaneously at two different memory ports. For example, a first memory access request may be received at port A and a second memory access request may be received at port B. In this scenario, arbitration circuit 222 may become metastable as illustrated in the waveform diagram shown in FIG. 3. In the example of FIG. 3, both clocks Aclk and Bclk have a rising edge at time 310. As a result, signals latcha and latchb produced on the outputs of registers 210A and 210B respectively may have a rising edge at time 320, which may cause signal PORTSEL produced by port selection circuitry 220 to become metastable. Port selection circuitry 220 may spend some time to resolve the metastability (e.g., the time corresponding to Tmet in FIG. 3). At time 330, after having resolved the metastability in signal PORTSEL, request generation circuit 230 may first grant memory access to port A as shown by a rising edge in signal reqa at time 340. Upon completion of the memory access by port A, a control circuit such as read/write management circuit 120 in FIG. 1B may send a corresponding control signal such as signal donea to the arbitration circuit. In response to receiving signal donea, request generation circuit 230 in arbitration circuit 222 may grant memory access to port B as shown by a rising edge in signal reqb at time 350.

Each memory access from a port may require access time Tacc. In this scenario, the maximum access time Twc for one port is equal to the sum of two access times plus the time to resolve metastability as shown in equation (1).

$$Twc = 2*Tacc + Tmet \qquad (1)$$

Storage circuit 111 may not be operated faster than the maximum access time Twc. It may be desirable to predict simultaneous memory access requests and employ preventive measures to avoid metastability in the arbitration circuit, thereby potentially reducing the maximum access time Twc by eliminating or otherwise reducing the time to resolve metastability Tmet.

A scenario that may cause a signal to become metastable is sometimes also referred to as a hazard. For example, memory access requests from different ports that occur sufficiently close in time may cause the signal PORTSEL in the arbitration circuit to become metastable and constitutes a hazard. A future hazard condition that may cause the signal PORTSEL in the arbitration circuit to become metastable (e.g., triggering events of the clock signals that control the memory access on the different memory ports and that occur sufficiently close to each other later in time) may be predicted ahead of time based on the triggering events of the clock signals.

A triggering event of a clock signal may depend on the circuitry that is controlled by that clock signal. For example, edge sensitive circuitry such as a flip-flop or register may be triggered by an active edge of a clock signal. In certain configurations, a register may be triggered by a rising edge of the clock signal. In other configurations, a register may also be triggered by a falling edge of a clock signal. Other circuitry may have different triggering events. For instance, double-edge-triggered flip-flops may sample and store input data at the rising and the falling clock edge, level sensitive circuitry such as latches may sample an input signal when the clock signal is either high or low, to name a few. Embodiments of the present invention may predict and prevent hazards in any clock signal controlled circuitry independent of the triggering event of that circuitry.

Figure 4:
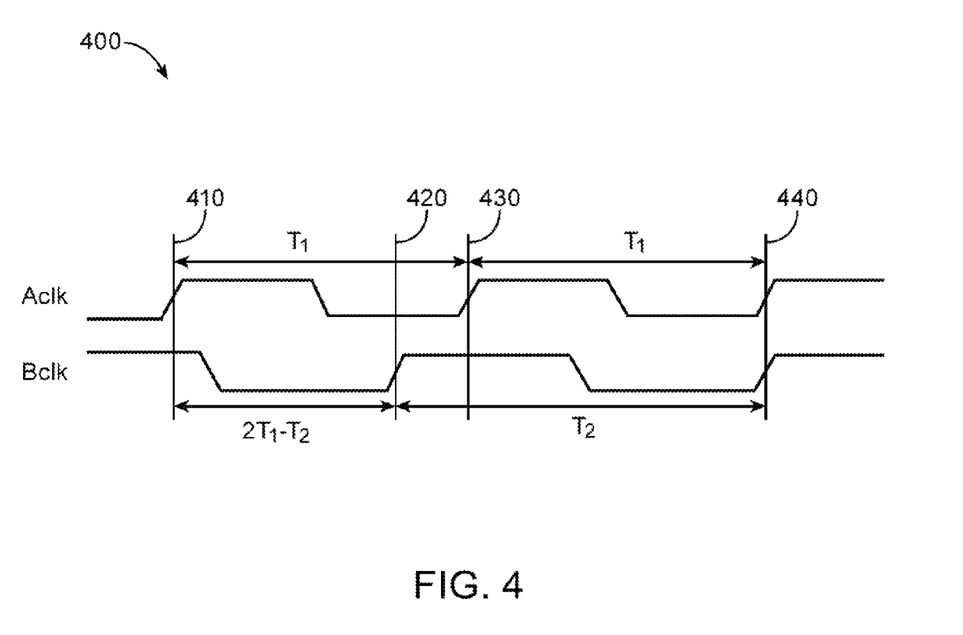
FIG. 4 is a waveform diagram helpful in explaining a method for predicting simultaneously rising clock edges of two asynchronous clocks in accordance with an embodiment of the present invention.

FIG. 4 shows a waveform diagram of two clock signals Aclk and Bclk. Clock signal Aclk may have a known period T1 and clock signal Bclk a known period T2 which may both be fixed to a reasonably high accuracy, subject to some variation or jitter. Consider the scenario where clock periods T1 and T2 differ from each other and clock period T2 is a non-integer multiple of clock period T1. The invention is primarily applicable to circumstances where the two clocks have different periods, but is not restricted to usage in these circumstances. For example, clock period T2 may be defined as T1<T2<2*T1 and Aclk and Bclk may have active clock edges that occur within a given time frame (e.g., in proximity of time 440). In this configuration, it may be desirable to predict the simultaneous triggering event earlier. Since Aclk has a triggering event at time 440, Aclk also has a triggering event one period T1 earlier at time 430 and two periods T1 earlier at time 410. Similarly, Bclk has a triggering event one period T2 earlier at time 420.

There are a variety of possible timing relationships between clock signals Aclk and Bclk that may be used to predict the simultaneous triggering event at time 440. For example, the simultaneous triggering event at time 440 may be predicted based on the triggering event of clock signal Aclk at time 410 and the triggering event of clock signal Bclk at time 420. In other words, if clock signal Bclk has a triggering event 2*T1−T2 after clock signal Aclk has a triggering event, then a simultaneous triggering event of clock signals Aclk and Bclk will happen a clock period T2 after the trigger event of clock signal Bclk at time 420. Alternatively, if clock signal Aclk has a triggering event at time 430 (i.e., T2−T1 after Bclk has a triggering event at time 420), then a simultaneous triggering event will happen a clock period T1 later. Other timing relationships between clock signals Aclk and Bclk may also be used to predict simultaneous triggering events, such as timing relationships between rising and falling edges, between falling and rising edges, between falling edges, between rising edges, involving multiple clock periods, etc.

Due to uncertainty in clock periods and signal delays, it may be desirable to provide additional time dt before and after the timing relationship that is used to predict a simultaneous triggering event. In the example above, a simultaneous triggering event may occur if clock signal Bclk has a triggering event in the time interval between 2*T1−T2−dt and 2*T1−T2+dt after clock signal Aclk has a triggering event.

Figure 5:
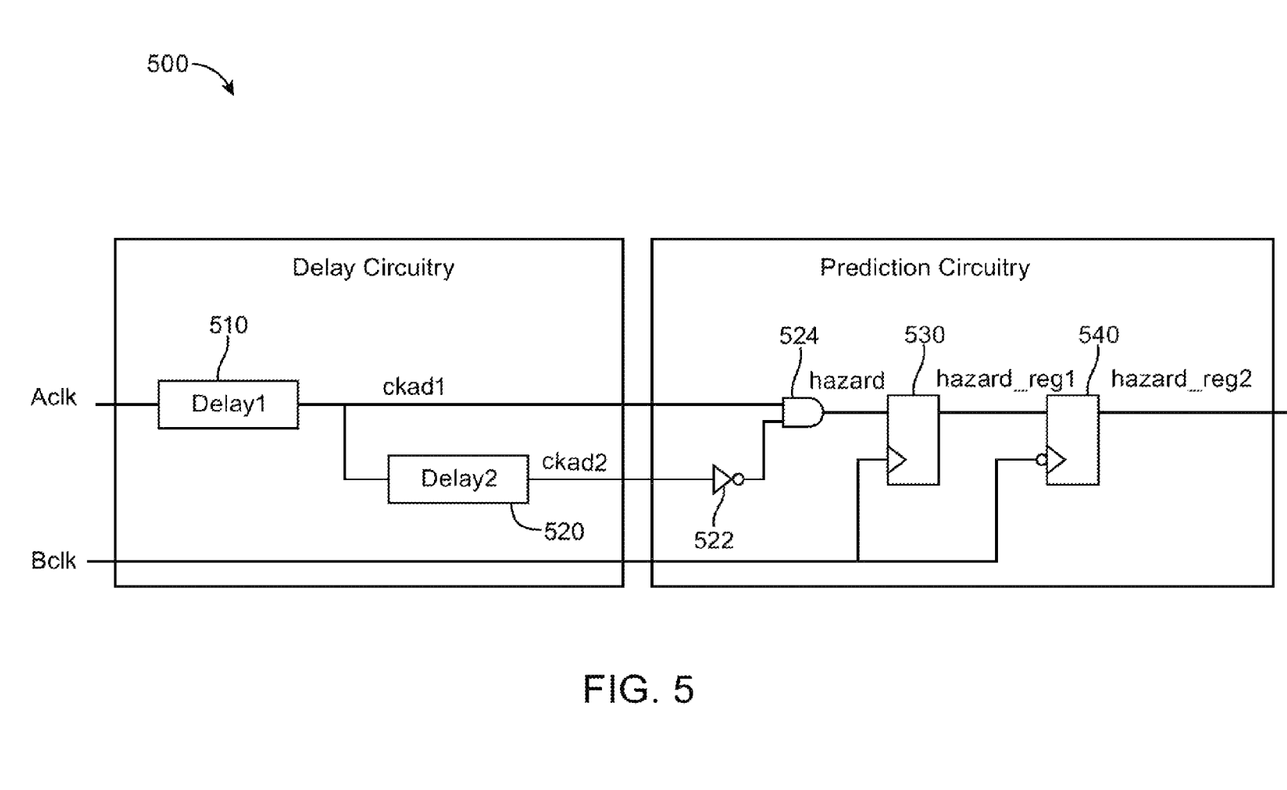
FIG. 5 is a diagram of illustrative circuitry to predict conflicts between two clock signals potentially leading to metastability in an arbitration circuit in accordance with an embodiment of the present invention.
Figure 6:
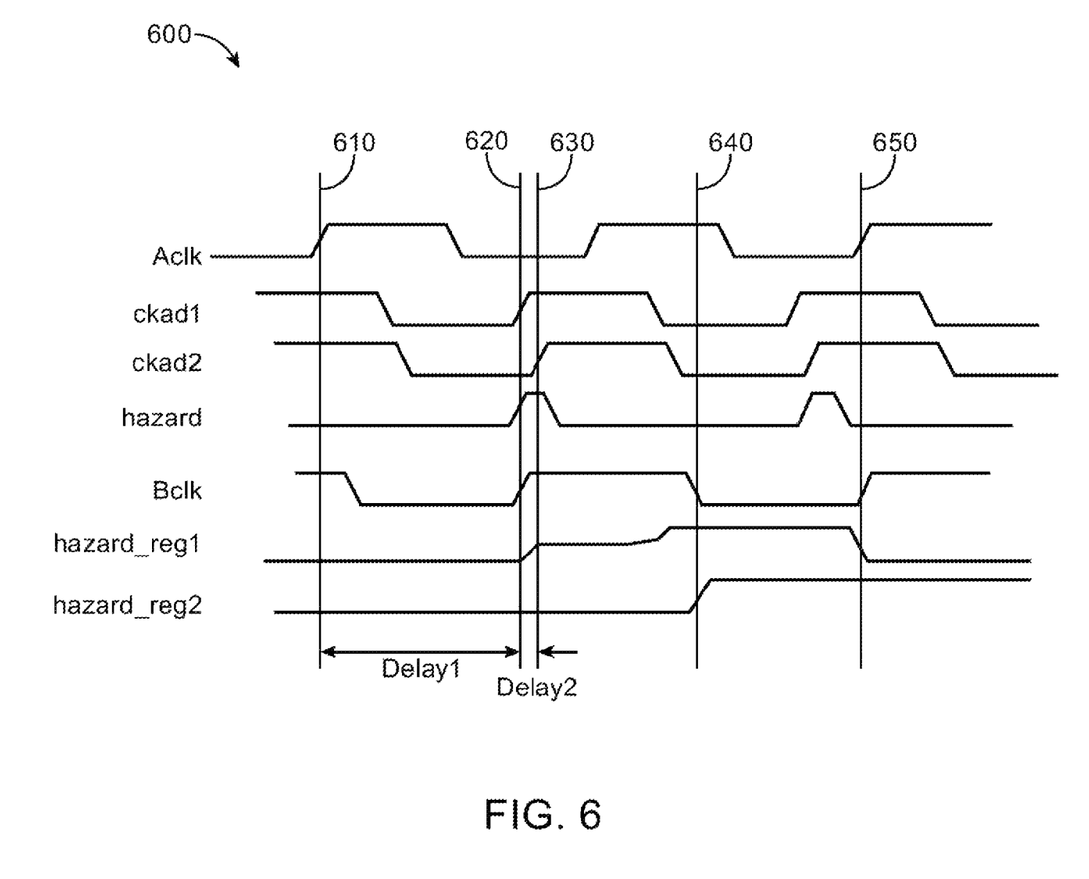
FIG. 6 is a waveform diagram illustrating the prediction of conflicts between two clock signals for the circuit shown in FIG. 5 in accordance with an embodiment of the present invention.

FIG. 5 shows an illustrative hazard prediction circuitry 500 for predicting simultaneous triggering events for clock signals Aclk and Bclk. FIG. 6 shows a waveform diagram 600 illustrating the signal propagation through hazard prediction circuitry 500.

Consider the scenario where clock signals Aclk and Bclk have a simultaneous triggering event at time 650. In this scenario, a triggering event is characterized by a rising edge of signals Aclk and Bclk. The simultaneous rising edges of signals Aclk and Bclk may be predicted by clock signal Bclk having a rising edge in the time interval 2*T1−T2−dt and 2*T1−T2+dt after clock signal Aclk has a rising edge at time 610. Clock signal Aclk may be delayed using time delay circuit 510 which may produce signal ckad1 by delaying clock signal Aclk by Delay1=2*T1−T2−dt. Further delaying signal ckad1 by Delay2=2*dt using time delay circuit 520 may produce signal ckad2. Performing a logical AND operation (e.g., using logic AND gate 524) of signal ckad1 and the inversion of ckad2 522 may produce a hazard pulse signal of a predetermined pulse duration such as signal hazard which may have a rising edge at time 620 (i.e., dt before latchb's anticipated rising edge) followed by a falling edge at time 630 (i.e., dt after latchb's anticipated rising edge). Register 530 may store signal hazard at the rising edge of signal Bclk, thereby producing signal hazard_reg1. Signal hazard_reg1 may transition from logic '0' to logic '1' at the rising edge of signal Bclk. Due to the uncertainty of the almost simultaneously occurring events on the data and clock ports of register 530, signal hazard_reg1 may become metastable at first. Signal hazard_reg1 may take up to half a clock period of T2 (i.e., until time 640) to resolve metastability. At time 640, register 540 may store signal hazard_reg1 at the falling edge of signal Bclk, thereby producing signal hazard_reg2 and ensuring that signal hazard_reg2 is stable on rising edges of signal Bclk.

Hazard prediction circuitry 500 and corresponding waveform diagram 600 are merely illustrative and are not intended to limit the scope of the present invention. If desired, hazard prediction circuitry 500 may use different logic functions to produce signal hazard based on signals ckad1 and ckad2. For example, signal hazard may be produced by performing a NOR operation of signal ckad2 and the inversion of signal ckad1 or by a look-up table implementing the function ckad1 AND NOT clkad2, to name a few. Other modifications to hazard prediction circuitry 500 are possible without changing the scope of the present invention. If desired, hazard prediction circuitry 500 may produce a signal hazard_reg2 that is logic '0' when a hazard is anticipated and logic '1' in all other cases. In this scenario, the circuitry controlled by signal hazard_reg2 may be modified accordingly.

Signal hazard_reg2 may predict a simultaneous rising edge of clock signals Aclk and Bclk leading to a simultaneous memory access request from port A and port B. As seen above, simultaneous memory access requests from ports A and B may result in potential metastability in arbitration circuit 222 of FIG. 2. Hazard prediction circuitry 500 may generate signal hazard_reg2 that may be logical '1' for one clock period T2, starting half a clock period T2 before a simultaneous rising edge of clock signals Aclk and Bclk.

Figure 7:
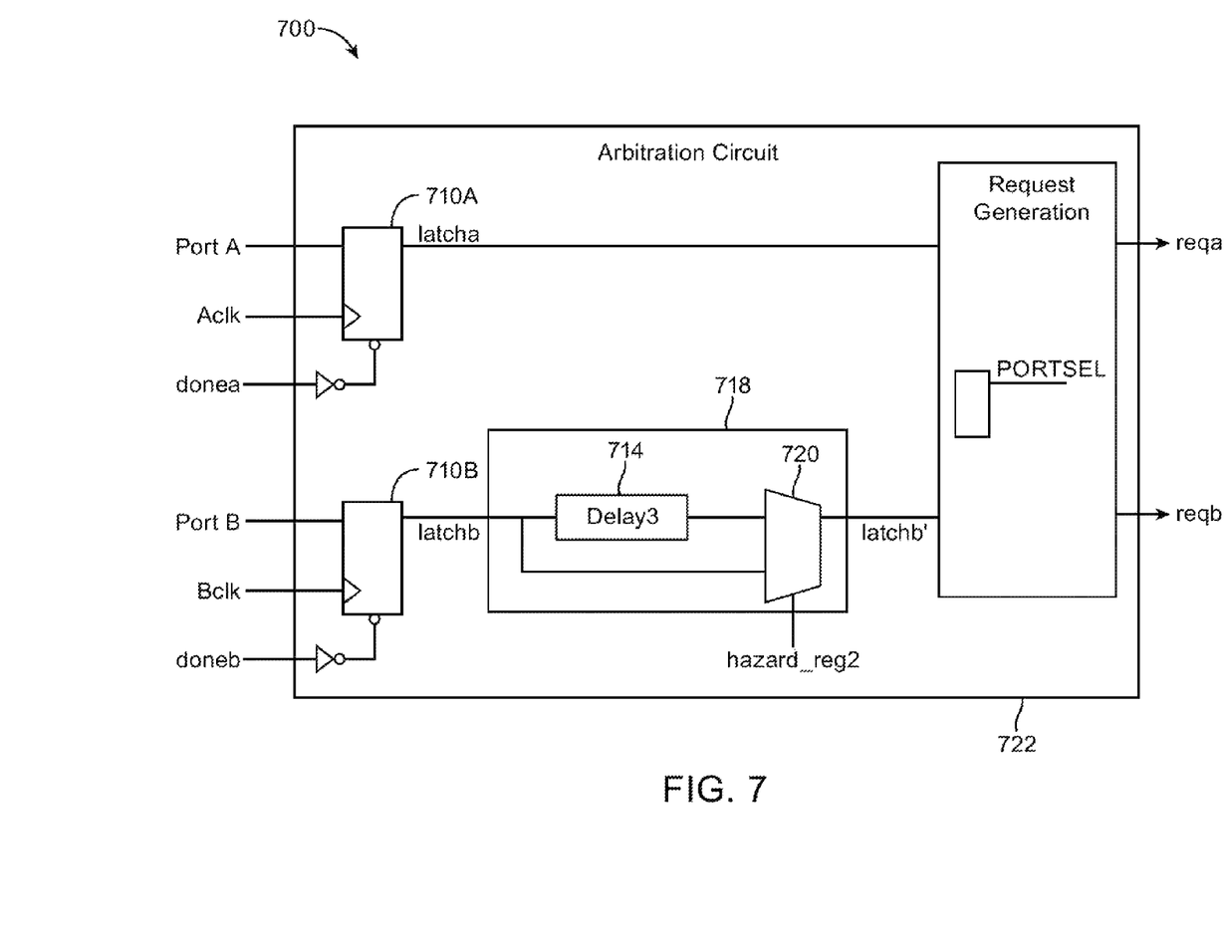
FIG. 7 is a diagram of illustrative single-port memory circuitry emulating dual-port memory circuitry with an arbitration circuit that delays memory access from one port based on the conflict prediction of FIG. 5 in accordance with an embodiment of the present invention.

FIG. 7 shows an illustrative diagram of circuit 700 that uses the signal hazard_reg2 generated by hazard prediction circuitry 500 (see FIG. 5) in hazard prevention circuitry 718 to prevent metastability in arbitration circuit 722. Hazard prevention circuitry 718 may have a time delay circuit 714 to delay memory access request on port B represented by signal latchb produced by register 710B in circuit 700 by a predetermined duration, such as a time corresponding to Delay3. Hazard prevention circuitry 718 may also include multiplexer 720 to produce memory access requests on port B represented by signal latchb' by selecting between signals latchb and time delayed latchb based on signal hazard_reg2 (e.g., a control signal such as signal hazard_reg2 produced by hazard prediction circuitry 500 of FIG. 5). For example, multiplexer 720 may select time delayed signal latchb to produce signal latchb' whenever hazard_reg2 predicts a simultaneous rising edge of clock signals Aclk and Bclk, and multiplexer 720 may select latchb in all other situations.

Figure 8:
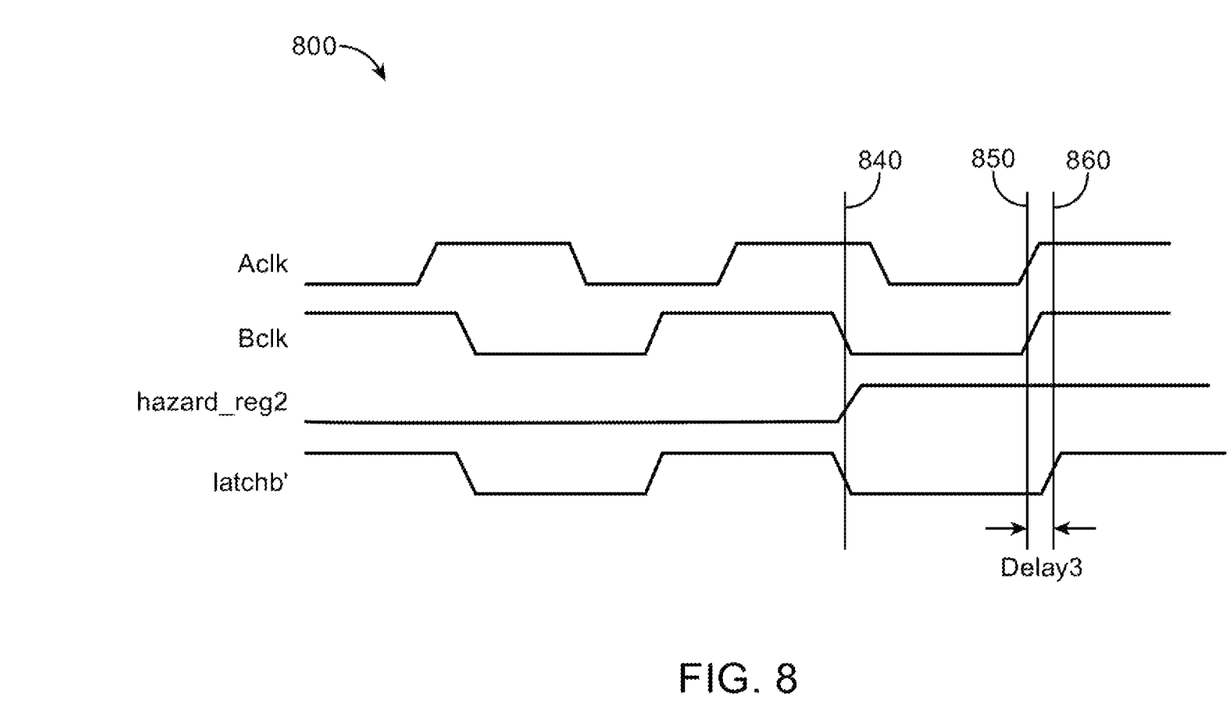
FIG. 8 is a waveform diagram helpful in illustrating the behavior of the circuitry shown in FIG. 7 in accordance with an embodiment of the present invention.

FIG. 8 shows a waveform diagram 800 illustrating the operation of certain aspects of circuit 700. Clock signals Aclk and Bclk may both have a rising edge at time 850 which may result in memory access requests from ports A and B reaching arbitration circuit 722 at the same time. As seen above, memory access requests from two different ports reaching arbitration circuit 722 at the same time may lead to metastability in the arbitration circuit.

As a result of predicting that both clock signals Aclk and Bclk have a rising edge at time 850, hazard prediction circuitry 500 shown in FIG. 5 may produce a transition from logical '0' to logical '1' in signal hazard_reg2 at time 840. Starting at time 840 and for as long as signal hazard_reg2 is high, multiplexer 720 in hazard prevention circuitry 718 may produce memory access request on port B (signal latchb') by selecting the time delayed signal latchb instead of the signal latchb. Therefore, instead of having a rising edge at time 850, signal latchb' may have a rising edge at time 860. Delaying the memory access request on port B from time 850 to 860 may prevent arbitration circuit 722 from producing two memory access requests for two different ports at the same time. Since the two memory access requests arrive subsequently instead of arriving simultaneously, metastability may be avoided. As a result, arbitration circuit 722 may first select the memory access request from port A for fulfillment before selecting the memory access request from port B for fulfillment. Therefore, the maximum access time Twc is reduced by the time to resolve metastability Tmet from Twc=Tmet+2*Tacc to Twc=2 Tacc.

Figure 9:
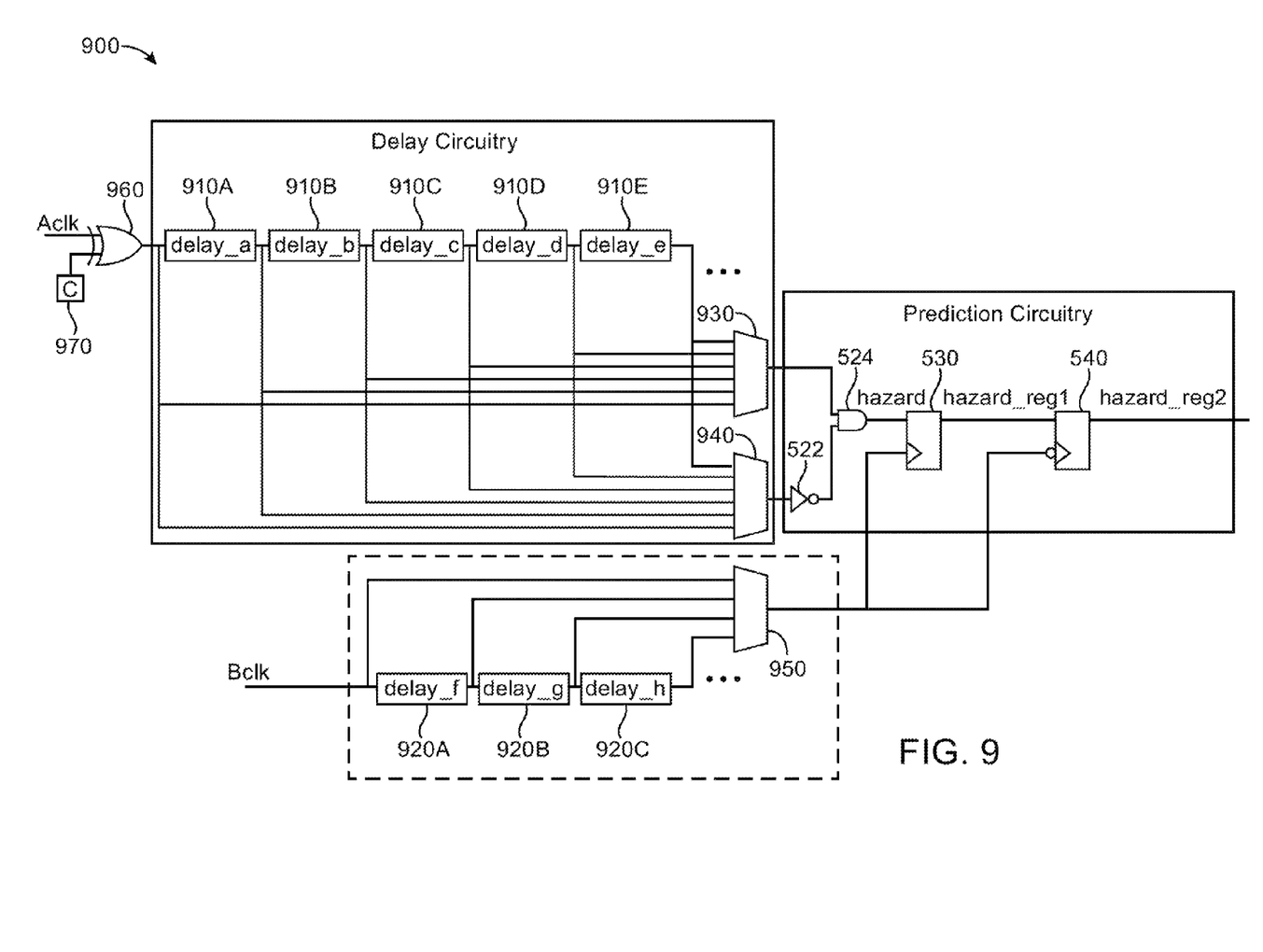
FIG. 9 is a diagram of illustrative circuitry for conflict prediction between two clock signals using configurable delay circuitry in accordance with an embodiment of the present invention.

Hazard prediction circuitry 500 may be used together with circuitry that is operated at arbitrary clock frequencies. For example, hazard prediction circuitry 500 may control access to programmable logic that may be configured to operate at clock periods determined during programming of the programmable logic. As a result, it may be desirable to implement hazard prediction circuitry 500 with programmable delays to enable support for circuitry that is operated at arbitrary clock frequencies. FIG. 9 shows a diagram of illustrative hazard prediction circuitry 900 that is operable to be used together with circuitry that is operated at arbitrary clock frequencies. Multiplexers 930 and 940 may choose from a wide variety of delays by selecting any of the cascaded delays 910 (e.g., delay 910A, 910B, 910C, etc.) to produce input signals to the logic AND gate 524 and the inverter 522 (see signals ckad1 and ckad2 in FIG. 5) respectively. Multiplexer 940 may choose a greater delay than multiplexer 930, but not a smaller delay. Delay circuits 910A through 910E may be arranged in series as shown in FIG. 9 and the output of each delay circuit may feed into multiplexers 930 and 940. Alternatively, delay circuits may be arranged in parallel, or they may be arranged in a mix of parallel and serial delay circuits.

Logic exclusive OR gate 960 and configurable memory bit 970 may be provided to control whether hazard prediction circuitry 900 indicates a rising edge of signal Bclk at the same time as a rising edge of signal Aclk or whether hazard prediction circuitry 900 indicates a rising edge of signal Bclk at the same time as a falling edge of signal Aclk. Storing a logic '1' in configurable memory bit 970 may generate the inversion of signal Aclk at the output of logic exclusive OR gate 960. Since the remainder of hazard prediction circuit 900 predicts simultaneous rising edges for Bclk and the output of logic exclusive OR gate 960, the hazard prediction circuitry 900 may indicate a rising edge of signal Bclk at the same time as a falling edge of signal Aclk when a logic '1' is stored in configurable memory bit 970. Similarly, storing a logic '0' in configurable memory bit 970 may generate signal Aclk at the output of logic exclusive OR gate 960, and the hazard prediction circuit 900 may indicate a rising edge of signal Bclk at the same time as a rising edge of signal Aclk.

Hazard prediction circuitry 900 may provide additional delay circuits 920A through 920C to delay signal Bclk. Multiplexer 950 may select between signal Bclk delayed by delay circuits 920A, 920B, or 920C. Delay circuits 920A through 920C may have smaller delays than delay circuits 910A through 910E. Delay circuits 920 may be arranged in series as shown in FIG. 9. Alternatively, delay circuits 920 may be arranged in parallel or in a mix of serial and parallel delay circuits. Delaying signal Bclk instead of signal Aclk may provide additional flexibility. For example, instead of delaying clock signal Aclk by almost half a clock period, it may be desirable to delay clock signal Bclk by a small delay compared to signal latchb's period.

Performing a logic AND operation of the signal produced by multiplexer 930 and the inversion of the signal produced by multiplexer 940 may produce the logic signal hazard. Register 530 may store the signal hazard at the rising edge of the signal produced by multiplexer 950, thereby producing signal hazard_reg1. Register 540 may store signal hazard_reg1 at the falling edge of the signal produced by multiplexer 950, thereby producing signal hazard_reg2.

Figure 10:
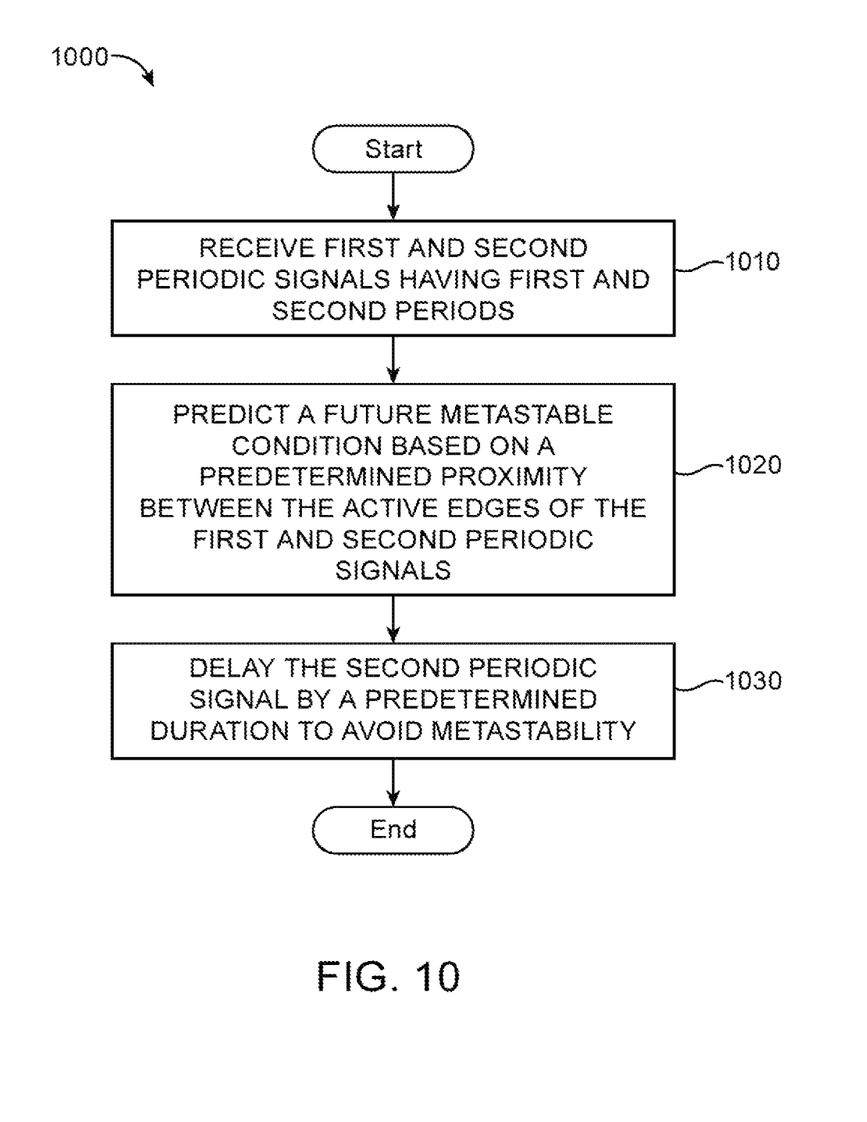
FIG. 10 is a flow chart of illustrative steps that may be performed to avoid a hazard condition based on relative timing between two periodic signals in accordance with an embodiment of the present invention.

FIG. 10 is a flow chart 1000 of illustrative steps that may be performed using hazard prediction circuitry for predicting hazards and avoiding metastability between two periodic signals in accordance with an embodiment of the present invention. During step 1010, a first and second periodic signal such as a first and second clock signal having a first and a second period may be received. Based on the predetermined proximity between the active edges of the two periodic signals, a future metastable condition may be predicted during step 1020. During step 1030, the second periodic signal may be delayed by a predetermined duration based on the metastable condition predicted during step 1020. Alternatively, the first periodic signal may be delayed by a predetermined duration or the first and second periodic signals may both be delayed each by a different amount of time.

Figure 11:
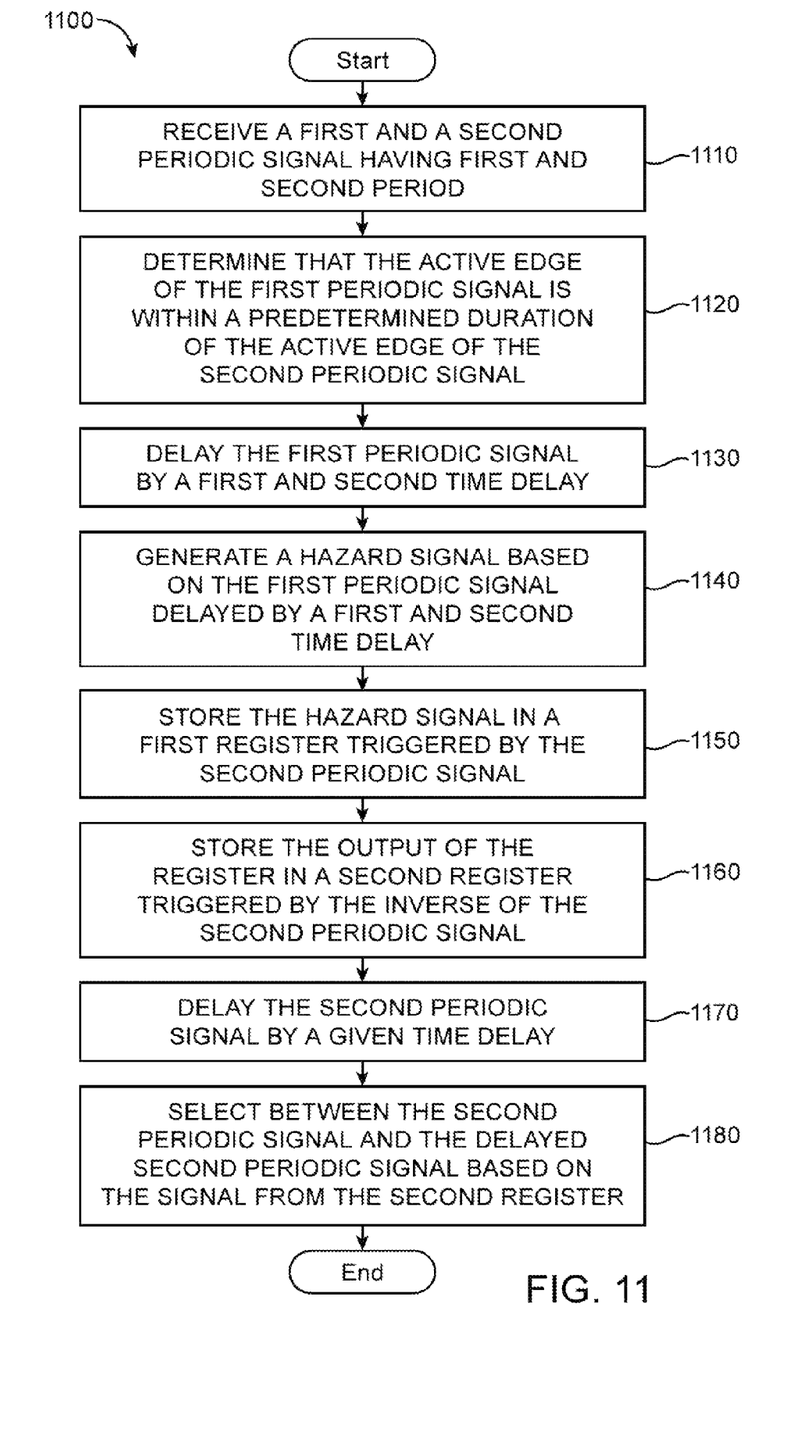
FIG. 11 is a flow chart of illustrative steps that may be performed to predict conflicts between two clock signals potentially leading to metastability in an arbitration circuit in accordance with an embodiment of the present invention.

FIG. 11 is a flow chart 1100 of illustrative steps that may be performed using hazard prediction circuitry for predicting hazards between two clock signals that may lead to metastability in the future, and delaying one of the clock signals to avoid such future metastability in accordance with an embodiment of the present invention.

During step 1110, a first and second periodic signal such as a first and second clock signal having a first and a second period may be received. During step 1120, the hazard prediction circuitry may determine that a future active edge of the first periodic signal is within a predetermined duration of the active of the second periodic signal and that such a configuration constitutes a hazard. The first periodic signal may be delayed by a first time delay and a second time delay thereby producing first and second delayed signals during step 1030. During step 1040, a hazard signal may be generated based on the first and second delayed signals. For example, a logic AND operation between the first delayed signal and the inverse of the second delayed signals may generate the hazard signal as shown in the prediction circuit of FIG. 5. Alternatively, a logic NOR operation may be performed between the inversion of the first delay signal and the second delay signal. Other combinations are also possible. The hazard signal may be stored in a first register which is triggered by the second periodic signal as shown in step 1150. During step 1160, the output of the first register may be stored in a second register which is triggered by an inversion of the second periodic signal. During step 1170, the second periodic signal may be delayed by a given time delay. Finally, during step 1180, the second periodic signal or the delayed second periodic signal may be selected based on the signal stored in the second register The method and apparatus described herein may be incorporated into any suitable electronic device or system of electronic devices. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. Circuitry comprising:
a first input that receives a first periodic signal having a first period;
a second input that receives a second periodic signal having a second period;
hazard prediction circuitry that predicts a future hazard condition between the first and second periodic signals, wherein the hazard prediction circuitry predicts the future hazard condition at a first instant of time, and the future hazard condition is predicted to occur at a second instant of time that is after the first instant of time; and
hazard prevention circuitry that selectively delays at least one of the first and second periodic signals by a first predetermined duration during at least one clock cycle of the respective periodic signal prior to the second instant of time.

2. The circuitry of claim 1 wherein the hazard prediction circuitry further comprises:
a delayed pulse generation circuit that generates a hazard prediction pulse having a predetermined pulse duration, the rising edge of the hazard detection pulse being delayed with respect to an active edge of the first periodic signal by a predetermined delay interval; and
an edge detection circuit that determines if an active edge of the second periodic signal occurs within the pulse duration of the hazard detection pulse.

3. The circuitry of claim 1 wherein the hazard prediction circuitry comprises an adjustable delay element.

4. The circuitry of claim 3 wherein the adjustable delay element comprises:
a plurality of fixed delay elements, wherein the plurality of fixed delay elements each produce a respective output signal; and
a multiplexer that receives each of the output signals from the plurality of fixed delay elements and produces a multiplexer output signal selected from the received output signals.

5. The circuitry of claim 4 wherein the plurality of fixed delay elements is coupled in series to form a delay path.

6. The circuitry of claim 1, wherein the hazard prediction circuitry further comprises:
a first register triggered based on the second periodic signal, wherein the first register receives and stores a hazard prediction signal that predicts the future hazard condition.

7. The circuitry of claim 6 further comprising:
a second register triggered based on an inversion of the second periodic signal, wherein the second register receives and stores the hazard prediction signal from the first register.

8. The circuitry of claim 7 further comprising:
a third delay element coupled between the second input and the first and second register, wherein the third delay element receives the second periodic signal and delays the second periodic signal by a third delay, wherein the first register is triggered based on the delayed second periodic signal, and wherein the second register is triggered based on an inversion of the delayed second periodic signal.

9. Circuitry that fulfills memory access requests, the circuitry comprising:
a first port at which a first memory access request is received using a first clock signal;
a second port at which a second memory access is received using a second clock signal; and
hazard prevention circuitry coupled to the first and second ports, wherein the hazard prevention circuitry delays the second memory access request and determines which of the first memory access request, the second memory access request, and the delayed second memory access request is to be selected for fulfillment.

10. The circuitry of claim 9 wherein the hazard prevention circuitry comprises a plurality of delay elements coupled to the second port and selects one of the plurality of delay elements to delay the second memory access request.

11. The circuitry of claim 9 further comprising:
hazard prediction circuitry that receives the first and second clock signal and produces a control signal predicting simultaneous triggering events by the first and second clock signal.

12. The circuitry of claim 11, wherein the hazard prevention circuitry further comprises:
a multiplexer that receives the second memory access request and the delayed second memory access request and selects from the received requests based on the control signal from the hazard prediction circuitry.

13. The circuitry of claim 12 wherein the hazard prevention circuitry determines which of the first memory access request, the second memory access request, and the delayed second memory access request is to be selected for fulfillment based on the control signal produced by the hazard prediction circuitry.

14. The circuitry of claim 12 wherein the hazard prediction circuitry further comprises:
   a first delay element that receives the first clock signal and produces a delayed first clock signal;
   a second delay element that receives the delayed first clock signal and produces a further delayed first clock signal; and
   logic circuitry that receives the delayed first clock signal and the further delayed first clock signal and produces a logic output signal based on the received signals.

15. The circuitry of claim 14 wherein the logic circuitry is configured to implement a logic AND operation of the delayed first clock signal and an inversion of the further delayed first clock signal.

16. The circuitry of claim 14 wherein the hazard prediction circuitry further comprises:
   a first register that receives the logic output signal and the second clock signal and stores the logic output signal based on a triggering event of the second clock signal; and
   a second register to produce the control signal, wherein the second register receives the second clock signal and the stored logic output signal from the first register and stores the stored logic output signal based on a triggering event of an inversion of the second clock signal.

17. The circuitry of claim 14 wherein the first delay element of the hazard prediction circuitry comprises a programmable delay element operable to select from a plurality of delays and to delay the first clock signal by one of the plurality of delays.

18. A method comprising:
   receiving a first periodic signal having a first period at a first input;
   receiving a second periodic signal having a second period at a second input;
   at a first instant of time, predicting a future hazard condition at an active edge of either the first or second periodic signal based on relative timing between the first and second periodic signals at the first instant of time, wherein the future hazard condition is predicted to occur at a second instant of time that is later than the first instant of time; and
   selectively delaying the active clock edge of either the first or second periodic signal by a first predetermined duration, wherein the active clock edge is associated with a clock cycle of the selectively delayed periodic signal prior to the second instant of time within a predetermined hazard duration.

19. The method of claim 18 wherein predicting the future hazard condition further comprises:
   determining that the active edge of the first periodic signal is within a second predetermined duration of the active edge of the second periodic signal.

20. The method of claim 19 further comprising:
   in response to determining that the active edge of the first periodic signal is within a second predetermined duration of the active edge of the second periodic signal, generating a hazard signal.

21. The method of claim 20 further comprising:
   generating a delayed periodic signal based on the second periodic signal delayed by a time delay; and
   selecting between the delayed periodic signal and the second periodic signal based on the hazard signal.

22. The method of claim 19, wherein generating the hazard signal further comprises:
   delaying the first periodic signal by a first time delay to produce a first delayed signal;
   delaying the first periodic signal by a second time delay to produce a second delayed signal; and
   generating an intermediate hazard signal based on the active edges of the first and second delayed signals.

23. The method of claim 22 further comprising:
   selecting the first time delay from a plurality of fixed time delays.

24. The method of claim 22 further comprising:
   storing the intermediate hazard signal on the active edge of the second periodic signal.

25. The method of claim 22 further comprising:
   delaying the second periodic signal by a third time delay to produce a third delayed signal;
   storing the intermediate hazard signal on the active edge of the third delayed signal; and
   storing the stored intermediate hazard signal on the active edge of the inverted third delayed signal.

* * * * *